United States Patent [19]

Hilton

[11] Patent Number: 4,700,327

[45] Date of Patent: Oct. 13, 1987

[54] DIGITAL MEMORY SYSTEM

[75] Inventor: Richard F. Hilton, Goleta, Calif.

[73] Assignee: Raytheon Company, Lexington, Mass.

[21] Appl. No.: 688,112

[22] Filed: Dec. 31, 1984

[51] Int. Cl.⁴ ............................................... G06F 1/00
[52] U.S. Cl. .................................................... 364/900
[58] Field of Search ................. 364/200, 900; 375/61, 375/78, 94, 122; 455/75, 87, 86, 18

[56] References Cited

U.S. PATENT DOCUMENTS

| | | | |
|---|---|---|---|
| 4,223,404 | 9/1980 | Lowenschuss | 375/94 |
| 4,318,183 | 3/1982 | Byington et al. | 364/900 |
| 4,366,540 | 12/1982 | Berglund et al. | 364/200 |
| 4,467,417 | 8/1984 | Woods et al. | 364/200 |

Primary Examiner—Gareth D. Shaw
Assistant Examiner—Christine M. Eakman
Attorney, Agent, or Firm—Peter J. Devlin; Richard M. Sharkansky

[57] ABSTRACT

An apparatus for digitally storing samples of a received signal having a carrier frequency component and an angle modulation component and for subsequently reconstructing such received signal from the stored samples. The system includes a pair of digital memory systems, a first one storing samples of a signal fed thereto at a relatively high rate, and a second one storing samples of a signal fed thereto at a relatively low rate. The received signal is coupled to the first memory system for a relatively short period of time for storing therein samples representative of the carrier frequency component. The received signal is also coupled to the second memory system for a relatively long period of time for storing therein samples representative of the angle modulation component. The samples stored in the first memory system representative of the carrier frequency component are cyclically retrieved over a relatively long period of time and at the relatively high rate, while the samples stored in the second memory system representative of the angle modulation component are retrieved over the relatively long period of time and at the relatively low rate. The samples cyclically retrieved from the first memory system are combined with the samples retrieved from the second memory system to produce a composite signal, such composite signal being reconstruction of the received signal. With such arrangement, the memory storage efficiency is increased by the ratio of the bandwidth of the wideband memory to the bandwidth of the narrow band memory.

4 Claims, 11 Drawing Figures

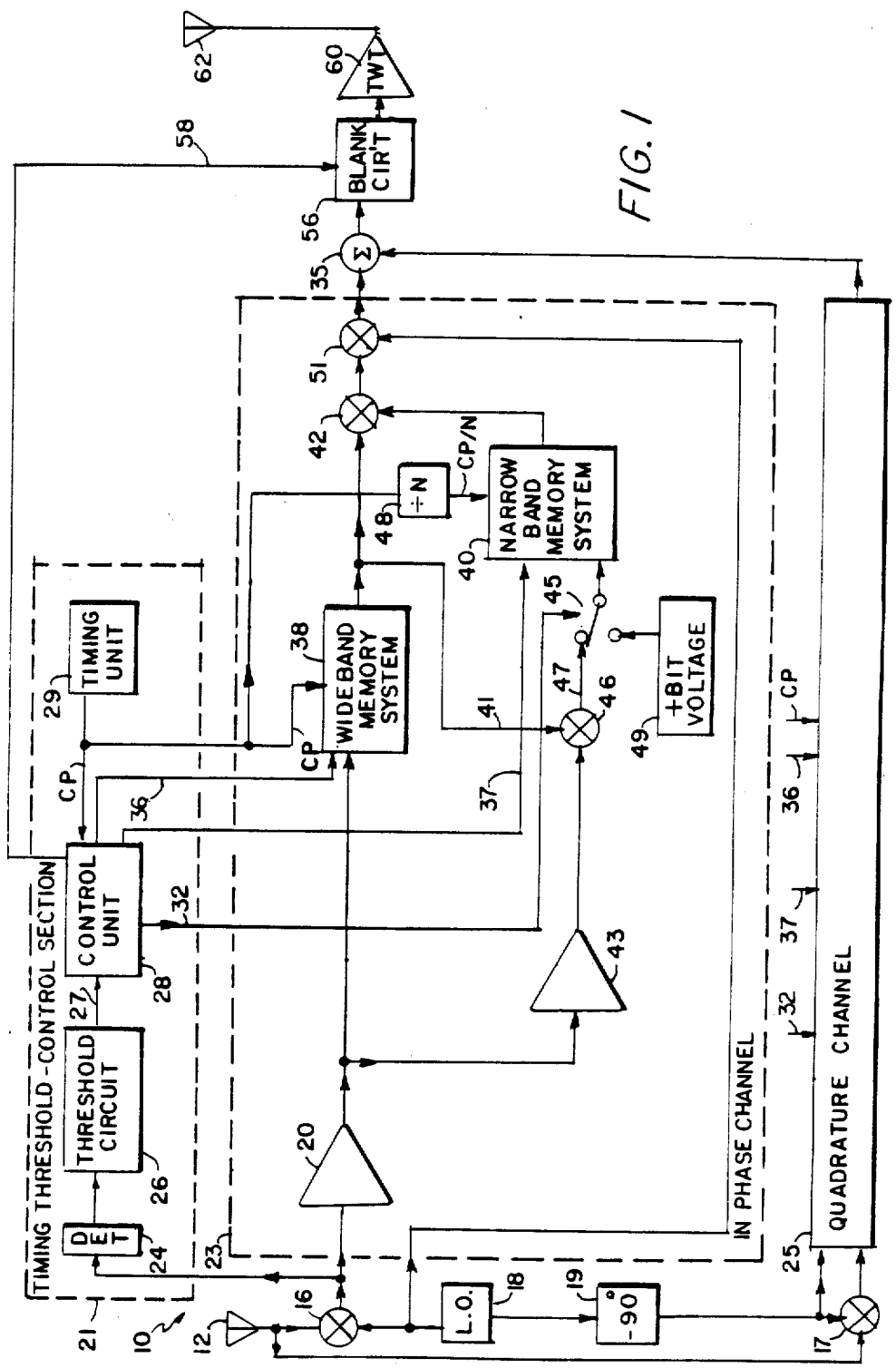

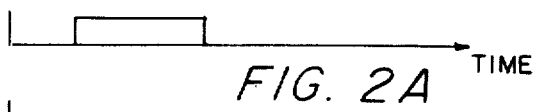
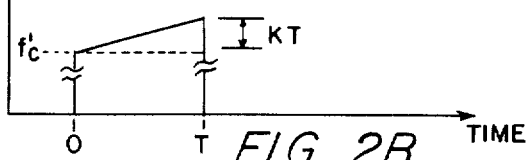
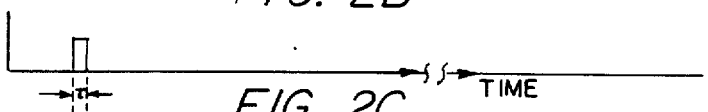
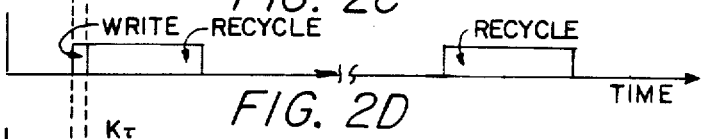
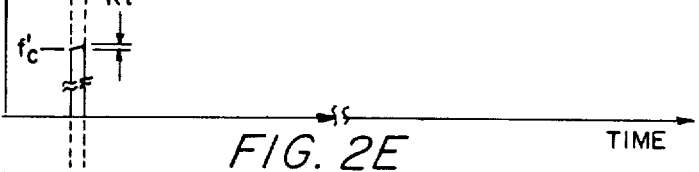
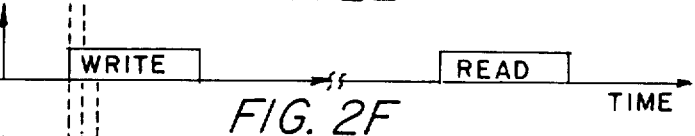
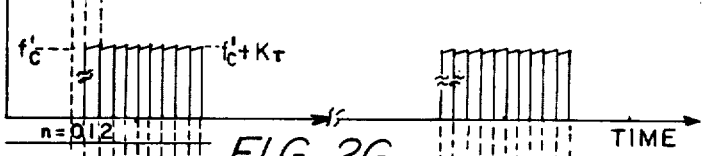
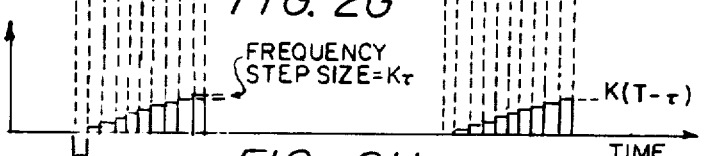
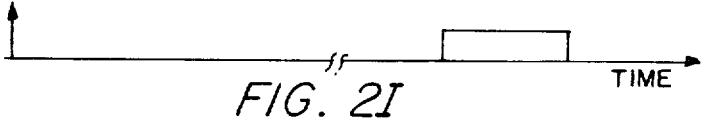
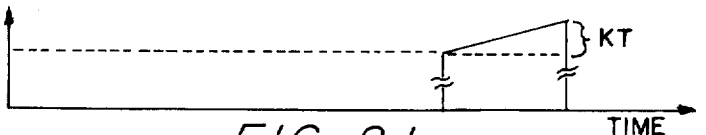

4,700,327

1

DIGITAL MEMORY SYSTEM

BACKGROUND OF THE INVENTION

This invention relates generally to digital memory systems and more particularly to digital memory systems which are adapted to store radio frequency signals and to enable subsequent retransmission of such signals.

As is known in the art, it is frequently desired to store a received radio frequency signal and later retransmit such signal. One digital memory system used for such retransmission is described in U.S. Pat. No. 4,318,183 issued Mar. 2, 1982, entitled "Multiple Channel Digital Memory System", inventors Roy E. Byington and William M. Pease, and assigned to the present assignee as the present invention. As discussed in such U.S. Pat. No. 4,318,183, to satisfy the Nyquist sampling criterion, the samples of the received signal should be taken at twice the bandwidth of the digital memory. Thus, if the maximum operating sampling rate of the digital memory is $2f_c$, the maximum bandwidth of the digital RF memory is $f_c$. It follows, then, that for applications requiring operation over a relatively large bandwidth and storage of samples of relatively long received signals, the storage capacity of the memory may become excessively large and expansive. One technique suggested to reduce storage capacity is to scan a narrow band memory system sequentially in time over different portions of the entire required operating bandwidth, such as by mixing the received signal with a local oscillator signal having a sequentially stepping frequency; however, the use of such arrangement is relatively costly and complex.

SUMMARY OF THE INVENTION

In accordance with the present invention, an apparatus is provided for digitally storing samples of a received signal having a carrier frequency component and an angle modulation component (i.e. a time varying phase angle) and for reconstructing such received signal from the stored samples comprising: a pair of digital memory systems, a first one thereof storing samples of a signal fed thereto at a relatively high rate; and a second one of the pair of memory systems storing samples of a signal fed thereto at a relatively low rate; means for coupling the received signal to the first one of the pair of digital memory systems for a relatively short period of time for storage in such first of one of the pair of memory systems samples representative of the carrier frequency component, for coupling the received signal to the second one of the pair of memory systems for a relatively long period of time for storage in such second one of the pair of memory systems samples representative of the angle modulation component of the received signal, and for cyclically retrieving, over a relatively long period of time and at the relatively high rate, the samples stored in the first one of the pair of memory systems representative of the carrier frequency component while retrieving, over the relatively long period of time and at the relatively low rate, the samples stored in the second one of the pair of memory systems representative of the angle modulation component; and, means, for mixing the samples cyclically retrieved from the first one of the pair of memory systems with the samples retrieved from the second one of the memory systems to produce a composite signal, such composite signal being a reconstruction of the received signal.

2

With such arrangement, because the system uses a narrow rather than wide bandwidth memory (i.e., the second one of the memory systems) over the time duration of a received signal pulse, the storage efficiency (measured in terms of bits required to store the signal) is increased by the ratio of the bandwidth of the wideband memory (i.e., the first one of the memory systems) to the bandwidth of the narrow band memory.

BRIEF DESCRIPTION OF THE DRAWINGS

The foregoing features of this invention, as well as the invention itself, may be more fully understood from the following detailed description read together with the accompanying drawings in which:

FIG. 1 is a block diagram of a radio frequency signal receiver/transmitter system according to the invention; and FIG. 2A-2J are time histories useful in understanding the operation of the system of FIG. 1.

DESCRIPTION OF THE PREFERRED EMBODIMENT

Referring now to FIG. 1, a radio frequency signal receiver/transmitter system 10 is shown for digitally storing samples of a received radio frequency signal having a carrier frequency signal component, $f_c$, and an angle modulation component, $\theta(t)$ (either a phase or frequency modulation component) and for reconstructing such received signal from the stored samples for retransmission. More particularly, system 10 includes a radio frequency receiving antenna 12, a pair of mixers 16, 17, a local oscillator 18, and a 90° phase shifter 19, all of conventional design and arranged to heterodyne the incoming, received, radio frequency signal having a carrier frequency $f_c$ within a predetermined frequency bandwidth of interest, here $f_o \pm 250$ MHz (where $f_o$ is the center frequency of the operating band, typically several GHz), to a baseband signal having a carrier frequency $f_c'$ within a bandwidth of 250 MHz. It is noted that the local oscillator frequency is also $f_o$. The baseband signal is fed to an in-phase channel 23 and a quadrature channel 25, as shown and described in the above-referenced U.S. Pat. No. 4,318,183. The channels 23, 25 are identical in construction, channel 23 being shown in detail.

As shown, in-phase channel 23 includes an amplifier 20, here having the same 250 MHz bandwidth as the baseband signal fed thereto. The output of mixer 16, in addition to being fed to amplifier 20, is also fed to a timing-threshold detection-control section 21, and more particularly to a conventional diode detector 24 and threshold circuit 26, as shown. The output of the threshold circuit 26 provides a binary control signal indicative of the presence or absence of an incoming signal; here the output of threshold circuit 26, i.e., line 27, is "low" in the absence of an incoming signal and is "high" in the presence of an incoming signal. The control signal produced at the output of threshold circuit 26 is fed to a control unit 28. Also fed to the control unit 28 are timing signals produced by timing unit 29 on line cp. Timing unit 29 is of any conventional design and produces clock pulses on line cp for the control unit 28 and for the in-phase and quadrature channels 23, 25. In response to clock signals produced by timing unit 29 and to control signals produced by control unit 28, in a manner to be described in detail hereinafter, digital samples of the baseband signals fed to the in-phase and quadrature channels 23, 25 become sequentially stored in such channels 23, 25; digital samples representative of the carrier frequency component of the baseband signal being stored in a relatively wideband digital R.F. memory 38 and digital samples representative of the angle modulation component of the baseband signal being stored in a relatively narrow band digital R.F. memory 40; and, the digital samples stored in memories 38, 40 become read therefrom and combined in a mixer 42 to a baseband angle modulated signal which is up-converted to a carrier frequency of $f_o$ by mixer 51. The output of mixer 51 is combined with the like signals produced by quatrature channel 25 in a summing network 35, and the combined signals are then fed to a blanking circuit 56, here a conventional gated amplifier, as shown, and as described in U.S. Pat. No. 4,318,183. As further described therein, in response to a control signal supplied to the blanking circuit 56 from the control unit 28 via line 58, in a manner to be described, the up-converted and combined signals are passed or inhibited from passing, to a conventional TWT power amplifier 60, as shown, for reasons to become apparent hereinafter. Suffice it to say here, however, that the combined and up-converted signals passed through blanking circuit 56 in response to the control signal fed thereto via line 58 are amplified in TWT 60 and are then re-transmitted via transmitting antenna 62.

Considering first the wide band and narrow band digital R.F. memories 38, 40, it is first noted that such memories are adapted to digitally store samples of the signals fed thereto when in a write mode and to have such stored samples retrieved therefrom when in a read mode. One such digital R.F. memory is described in FIG. 2 of the above-referenced U.S. Pat. No. 4,318,183. It should be noted that the memories 38, 40 need not be identical in construction; while memory 38 has to be constructed using high speed circuits such as emitter-coupled-logic (ECL) circuits, memory 40 may be constructed using lower speed circuits such as transistor-transistor-logic (TTL) circuits. As described therein, a four phase clocking arrangement is used for four memory modules in an arrangement which allows digital storage and retrieval at an effective sampling rate 500 MHz to thereby satisfy the Nyquist sampling criterion. Thus, the digital R.F. memory 38 may be considered as having a 250 MHz instantaneous bandwidth. As noted in U.S. Pat. No. 4,318,183, the clock signals fed to the wideband digital R.F. memory 38 via line cp (which may be considered as a bus having four lines for each of the four clock signals described in U.S. Pat. No. 4,318,183) are at a rate to operate storage and retrieval of samples at the 500 MHz rate even though the rate of clock pulses on each of the four lines of bus cp is at a 250 MHz rate. The clock pulses on "bus" cp are also fed to narrow band memory system 40 after the rate of such clock pulses is reduced by a factor of (1/N) by divider 48. Thus, the clock pulses on bus are only at a rate of 1/N of the 250 MHz rate of the clock pulses on the four lines of "bus" cp. Thus, the effective sampling rate of the narrow band digital R.F. memory 40 is (500/N) MHz with the result that the instantaneous bandwidth of narrow band digital R.F. memory 40 is (250/N) MHz, or here, where N=25, a 10 MHz instantaneous bandwidth. As mentioned briefly above, the bandwidth of the wideband digital R.F. memory 38 is sufficient to properly sample, within the Nyquist criterion, the instantaneous frequency of a predetermined initial portion of the baseband signal, (i.e., the sum of the carrier frequency component $f_c'$ of the baseband signal produced at the output of mixer 16 and the initial portion of the instantaneous rate of change of the angle modulation component of the baseband signal $\Delta f_c'(t)$, i.e. $f_{ci}=(f_c'+\Delta f_c'(t))$ and the bandwidth of the narrow band digital R.F. memory 40 is sufficient to properly sample within the Nyquist criterion the difference between the instantaneous frequency of the predetermined initial portion of the baseband signal $f_{ci}$ and the instantaneous frequency $f_s$ of the subsequent portion of the baseband signal; i.e., the frequency difference $(f_s-f_{ci})$; thus, here $(f_s-f_{ci})$ is less than $f_{ci}/N$ or less than 10 MHz. It is also herein noted that while here both memories 38, 40 have substantially the same storage capacity, since narrow band digital R.F. memory 40 operates at (1/N)th, or here 1/25th, the rate as wideband digital R.F. memory 38, it is able to store samples of a signal fed thereto having a 25 times longer duration as compared with that of the wideband digital R.F. memory 38. As will be described in detail hereinafter, the wide band digital R.F. memory 38 stores, generally, samples of only a small time slice of the incoming signal; however, such samples are sufficient to represent a signal, albeit of short time duration, having as the frequency thereof, $f_{ci}$ (i.e., the sum of the carrier frequency component of the baseband signal, i.e., the frequency $f_c'$, and the instantaneous rate of change of the angle modulation component of the initial, predetermined portion of the incoming signal, i.e., $\Delta f_c'(t)$) while the narrow band digital R.F. memory system 40 stores, generally, samples of a signal having the difference between the instantaneous frequency of the predetermined, initial portion of the baseband signal, i.e., $f_{ci}$ and the instantaneous frequency of the subsequent portion of the baseband signal $f_s$; i.e., the frequency difference $f_s-f_{ci}$. Thus together, all of the frequency and angle modulation information of the incoming signal is digitally stored; the carrier frequency component $f_c'$ and the instantaneous rate of change of the angle modulation component of the initial portion of the incoming signal $\Delta f_c'(t)$ being stored in the wide band, higher operating rate memory 38 and the difference between the instantaneous frequency of the predetermined, initial portion of the baseband signal $f_{ci}=f_c'+\Delta f_c'(t)$ and the instantaneous frequency of the subsequent portion of the baseband signal $f_s$; i.e., the frequency difference $f_s-f_{ci}$ being stored in the narrow band, lower operating rate memory 40.

Thus, referring in more detail to the in-phase channel 23, and realizing that the quadrature channel 25 operates in a like manner, in response to an incoming signal, the output of threshold circuit 26 produces a "high" signal on line 27 as shown in FIG. 2A. By way of example, consider that the incoming radio frequency signal is a "chirp" pulse, i.e., a pulse having a carrier frequency $f_c$ linearly increasing in time at a constant rate K. Thus, the incoming pulse may be represented by:

$$A \sin 2\rho(f_c t+(\tfrac{1}{2})Kt^2)=A \sin (\phi_I(t))$$

where t is time; $f_c$ being the carrier frequency component and K being a constant. The instantaneous frequency, f(t), is $$\frac{d[\phi_I(t)]/dt}{2\pi} = (f_c + Kt).$$

After heterodyning in mixer 16, the frequency of the resulting baseband signal $(A' \sin (\phi_I'(t)))$ may be represented as:

$$(f_c - f_o) + Kt = \frac{d[\phi_f'(t)]/dt}{2\pi}$$

or $$f_c' + Kt$$

where $f_c'$ is the carrier frequency component of the baseband signal and Kt is the frequency modulation component of such baseband signal. The time history of the frequency of the received signal, at baseband, is shown in FIG. 2B. The baseband signal, after passing through amplifier 20 is shown serially coupled to the input of the wide band digital R.F. memory 38. The write/read/recycle operation of the wide band memory system 38 is controlled by control signals fed thereto from control unit 28 via control bus 36 and the read-/write operation of the narrow band memory system 40 is controlled by control signals fed thereto from control unit 28 via control bus 37. Here, in response to an incoming signal, control unit 28 produces a write control signal on control bus 36 for a predetermined relatively short period of time, $\tau$, as shown in FIG. 2D. It is noted in comparing FIG. 2B with FIG. 2D that in the example considered, the write control signal on control bus 36 has a period of time substantially shorter in time duration than the duration of time of the received chirp pulse. During this predetermined, relatively short period of time, samples of the baseband signal fed to the input of wideband memory 38 become sequentially stored in such memory 38 at an effective sampling rate of, here, 500 MHz.

It is also noted that the baseband signal passing through amplifier 20 is also fed through a limiting amplifier 43 to a mixer 46. Also fed to the mixer 46 is the output of wideband memory 38. The limiting amplifier 43 and the wideband memory system 38 produce output signals having the same voltage swings. The mixer 46 is used to produce a beat frequency signal having an instantaneous phase equal to the difference between the instantaneous phase of the baseband signal passing through amplifier 43 and the instantaneous phase of the signal produced at the output of the wide band memory 38. This beat frequency signal is fed via line 47 to a switch 45. Also fed to switch 45 is a voltage source 49; the voltage produced by voltage source 49 is constant and is equal to the voltage produced by the mixer 46 when the instantaneous phase of the baseband signal and the instantaneous phase of the signal produced at the output of memory 38 are equal; that is, the voltage produced by voltage source 49 is equal to the zero beat voltage produced by mixer 46. When switch 45 is de-activated, as shown in FIG. 1, the input to the narrow band memory 40 is electrically coupled to the output of mixer 46 and the voltage source 49 is electrically decoupled from the input of the narrow band memory 40; on the other hand, when switch 45 is activated by a "high" signal on line 32, the output of mixer 46 is electrically decoupled from the input to memory 40 and the voltage source 49 is electrically coupled to the input of narrow band memory 40. It follows then that during the predetermined, relatively short period of time that the signal on line 32 (FIG. 2C) is "high" (i.e., during the initial time period $\theta$ when a slice of the baseband signal is being sampled and stored in the wide band memory 38 (the time history of the frequency of such signal being shown in FIG. 2E as substantially equal to the baseband carrier frequency component $f_c'$)) a write signal is produced by control unit 28 and is fed to memory 40 via control bus 37 as shown in FIG. 2F and the constant voltage of supply 49 is being sampled and is thus stored in narrow band memory 40 (i.e., samples of a signal having substantially "zero" frequency, as shown in FIG. 2H). After the predetermined, relatively short period of time, $\tau$, switch 45 is de-activated by a "low" signal on line 32 (as shown in FIG. 2C). When de-activated, wide band memory 38 is placed in a recycle mode via the control signal on control bus 36 (see FIG. 2D) with the result that the stored samples recycle through the wide band memory 38, again at the 500 MHz rate. Thus, the time history of the frequency of the signal produced at the output of wide band memory 38 is as represented in FIG. 2G and is a cyclically repeated replica of the predetermined initial portion of the baseband signal having the carrier frequency, at baseband, i.e., $f_c' + K(t - n\tau)$, where n = the number of recycles of the replica produced at the output of the wide band memory 38 and is fed to mixer 46 via line 41. Concurrently therewith, the incoming baseband signal is, after passing through amplifiers 20, 43, mixed with the recycling slice read from wide band memory 38 in mixer 46 and the resulting beat signal is produced by mixer 46. The signal produced at the output of the wide band memory may be represented as:

$$A' \sin [\phi_w(t)] = A' \sin [2\pi(f_c - f_o)t' + (\tfrac{1}{2})Kt'^2]$$

where $t' = (t - n\tau)$; $0 \geq t' \geq \tau$; and n = 0, 1, 2 ... and the signal produced at the output of mixer 46 may be represented as:

$$A'' \cos[\phi_f'(t) - \phi_w(t)] = A'' \cdot \cos[2\pi f_c n\tau - \pi K n^2 \tau^2 + 2\pi K n\tau t] = A'' \cos[\phi n(t)]$$

where $2\pi f_c n\tau - \pi K n^2 \tau^2$ is a time invarient phase term and $K n\tau$ is a frequency component. The signal produced at the output of mixer 46 is passed to the input of narrow band memory 40. The frequency of the signal produced at the output of mixer 46 is shown in FIG. 2H. Here, the frequency increases in steps of $K\tau$. Since memory 40 is still in the write mode (FIG. 2F), samples of the signal produced at the output of mixer 46, the time history of the frequency of such signal being shown in FIG. 2H, are taken and stored in narrow band memory 40 at the 20 MHz rate.

It is noted that if the storage capacity of both the wide band memory 38 and the narrow band memory 40 are the same, because narrow band memory 40 stores samples at a rate 25 times lower than memory 38 (which it is able to do and still satisfy the Nyquist criterion because the expected bandwidth of the signal fed to narrow band memory 40 is 25 times smaller than that expected of the signal fed to wide band memory 38) than memory 40 can store samples of the signal fed to it for a time duration 25 times longer than that which memory 38 is able to store which is adequate since only a small slice of the baseband signal is needed to store the carrier frequency component whereas a longer time duration is needed to store the angle modulation component of the signal.

For retransmission, blanking circuit 56 is activated by the control signal on line 58, as shown in FIG. 2I, and memories 38, 40 are placed in the read mode as shown in FIGS. 2D and 2F. It is noted that prior to the activation of blanking circuit 56, signals read from memory 38 are prevented from passing to TWT 60 for transmission.

When retransmission is desired, the control unit 28 places wide band memory 38 in the recycle mode via a control signal on bus 36 and also places narrow band memory 40 in the read mode via a control signal on bus 37, as shown in FIGS. 2D and 2F, so that samples of the initial slice of the baseband signal stored in wide band memory 40 are retrieved at the 500 MHz rate and are recycled for a relatively long period of time, the time history history of such signal being shown in FIG. 2G. Simultaneously therewith, the samples stored in narrow band memory 40 are read therefrom at the 20 MHz rate; the time history of the frequency of such signal being shown in FIG. 2H. The signals read from wide band memory 38 and narrow band memory 40 are passed together to a mixer 42 and thereby combine to produce a signal at the output of mixer 42 having a baseband frequency component $f_c'$ and the angle modulation component $\theta(t)$; that is a signal having the same frequency characteristics as the down-converted, baseband signal produced by mixer 16. This thus produced reconstructed baseband signal (the time history of the frequency of such signal being shown in FIG. 2J) is up-converted in frequency to a radio frequency signal by passing such reconstructed baseband signal (i.e., the output of mixer 42) to mixer 51 along with the local oscillator signal produced by local oscillator 18. The up-converted signal is then combined with the up-converted signal produced by quadrature channel 25 in combiner 35, as described above, to thereby produce a replication of the received radio frequency pulse. The produced pulse is then passed through activated blanking circuit 56 to TWT 60 for amplification and retransmission by antenna 62.

Having described a preferred embodiment of the invention, it is now evident that other embodiments incorporating these concepts may be used. For example, the use of digital logic circuits such as exclusive OR or NOR gates may be used in place of the mixers. Still further, the system is capable of storing signals other than chirp pulses, such as continuous wave Doppler shifted signals, pulse Doppler signals, linear or non-linear frequency modulated signals, non-linear chirp pulses, phase coded signals, or pulsed signals provided that the signal frequency modulation component is less that the bandwidth of the narrow band digital R.F. memory. It is felt, therefore, that this invention should not be restricted to the disclosed embodiment, but rather should be limited only by the spirit and scope of the appended claims.

What is claimed is:
1. An apparatus for digitally storing samples of a received signal having a carrier frequency component and an angle modulation component and for subsequently reconstructing such received signal from the stored sample comprising:
  (a) a pair of digital memory systems, a first one thereof storing samples of a signal fed thereto at a relatively high rate and, a second one of the pair of memory systems storing samples of a signal fed thereto at a relatively low rate;
  (b) means for coupling the received signal to the first one of the pair of digital memory systems for a relatively short period of time for storage in such first of one of the pair of memory systems samples representative of the carrier frequency component, for coupling the received signal to the second one of the pair of memory systems for a relatively long period of time for storage in such second one of the pair of memory systems samples representative of the angle modulation component of the received signal, and for cyclically retrieving, over a relatively long period of time and at the relatively high rate, the samples stored in the first one of the pair of memory systems representative of the carrier frequency component while retrieving, over the relatively long period of time and at the relatively low rate, the samples stored in the second one of the pair of memory systems representative of the angle modulation component; and,
  (c) means, for mixing the samples cyclically retrieved from the first one of the pair of memory systems with the samples retrieved from the second one of the memory systems to produce a composite signal, such composite signal being a reconstruction of the received signal.

2. In combination:
  (a) a pair of digital memory systems, a first one thereof storing samples of a signal fed thereto at a relatively high rate and a second one of the pair of memory systems storing samples of a signal fed thereto at a relatively low rate;
  (b) means for coupling an input signal to the first one of the pair of digital memory systems;
  (c) a mixer;
  (d) means for coupling the input signal to the mixer;
  (e) means for: enabling storage in such first one of the pair of digital memory systems samples of an initial portion of the input signal; for cyclically retrieving the samples stored in the first one of the pair of memory systems at the relatively high rate; and for electrically coupling such cyclically retrieved samples to the mixer simultaneously as a portion of the input signal subsequent to the initial portion of the input signal is also electrically coupled to the mixer;
  (f) means for coupling the output of the mixer to the second one of the pair of memory systems; and
  (g) means for enabling storage in such second one of the pair of memory systems samples of the signal produced at the output of the mixer, such samples being stored at the relatively low rate.

3. The combination recited in claim 2 including an additional mixer fed by the outputs of the pair of digital memory systems for combining samples cyclically retrieved from the first one of the pair of memory systems with samples retrieved from the second one of the pair of memory systems.

4. In combination:
  (a) means for directing an input signal to a pair of signal channels;
  (b) a pair of digital memory systems, each one being disposed in a corresponding one of the pair of signal channels;
  (c) a combiner coupled to the output of the pair of digital memory systems; and
  (d) a mixer, disposed in the second one of the pair of the channels and fed by the output of the first one of the pair of digital memory systems disposed in the first one of the pair of signal channels, the output of such mixer being coupled to an input of the second one of the pair of digital memory systems.

* * * * *